United States Patent [19]

Pogge

[11] Patent Number: 6,110,806
[45] Date of Patent: Aug. 29, 2000

[54] PROCESS FOR PRECISION ALIGNMENT OF CHIPS FOR MOUNTING ON A SUBSTRATE

[75] Inventor: H. Bernhard Pogge, Hopewell Junction, N.Y.

[73] Assignee: International Business Machines Corporation, Armonk, N.Y.

[21] Appl. No.: 09/280,798

[22] Filed: Mar. 26, 1999

[51] Int. Cl.$^7$ .............................. H01L 21/30; H01L 21/46
[52] U.S. Cl. ......................... 438/458; 438/459; 438/401; 438/975; 438/977; 257/797
[58] Field of Search ...................... 438/118, 119, 438/401, 455, 458, 459, 463, 940, 975, 977; 257/797

[56] References Cited

U.S. PATENT DOCUMENTS

| | | |
|---|---|---|
| 4,670,770 | 6/1987 | Tai . |
| 4,783,695 | 11/1988 | Eichelberger et al. .................... 357/65 |
| 4,884,122 | 11/1989 | Eichelberger et al. . |
| 4,933,042 | 6/1990 | Eichelberger et al. . |
| 4,949,148 | 8/1990 | Bartelink . |
| 5,019,535 | 5/1991 | Wojarowski et al. . |
| 5,173,759 | 12/1992 | Murano ..................................... 257/88 |
| 5,353,498 | 10/1994 | Fillion et al. . |
| 5,373,627 | 12/1994 | Grebe ....................................... 29/841 |
| 5,532,519 | 7/1996 | Bertin et al. ............................. 257/777 |
| 6,025,638 | 2/2000 | Pogge et al. ............................. 257/618 |
| 6,040,204 | 3/2000 | Herden et al. ........................... 438/109 |

OTHER PUBLICATIONS

J. Pilchowski et al., "Silicon MCM with Fully Integrated Cooling," HDI Magazine, May 1998, p. 48.
J. Wolf et al., "System Integration for High Frequency Applications," Intl. J. of Microelectronics and Electronic Packaging 21, 119 (1998).
C.A. Armiento et al., "Gigabit Transmitter Array Modules on Silicon Waferboard," IEEE Transactions on Components, Hybrids and Manufacturing Technology 15, 1072 (1992).
M. Töpper et al., "Embedding Technology—A Chip–First Approach Using BCB," 1997 Intl. Symposium on Advanced Packaging Materials, p. 11.
Jeffrey T. Butler et al., "Advanced Multichip Module Packaging of Micromechanical Systems," 1997 Intl. Conf. on Solid–State Sensors and Actuators, p. 261.
Robert Boudreau et al., "Wafer Scale Photonic–Die Attachment," IEEE Trans. on Components, Packaging and Manufacturing Technology–Part B, 21, 1070 (1998).
Z. Xiao et al., "Low Temperature Silicon Wafer–to–Wafer Bonding with Nickel Silicide," J. Electrochem. Soc. 145, 1360 (1998).
R. Fillion et al., "Plastic Encapsulated MCM Technology for High Volume, Low Cost Electronics," Circuit World 21, 28 (1995).

*Primary Examiner*—Donald L. Monin, Jr.
*Assistant Examiner*—Ginette Peralta
*Attorney, Agent, or Firm*—Jay H. Anderson

[57] ABSTRACT

A method is described for fabricating a module having a chip attached to a carrier substrate, wherein a guide substrate transparent to ablation radiation is used. A removable layer is provided on a surface of the guide substrate. A first alignment guide is formed on the removable layer, and a second alignment guide is formed on a front surface of the chip. The chip is aligned to the guide substrate by contacting the second alignment guide to the first alignment guide; the chip is then attached to the guide substrate. The carrier substrate is attached to the chip at the back surface of the chip. The interface between the removable layer and the guide substrate is then ablated using radiation (typically laser radiation) transmitted through the guide substrate, thereby detaching the guide substrate. Thin films with metal interconnections may then be provided on the front surface of the chip.

21 Claims, 7 Drawing Sheets

PROCESS FOR PRECISION ALIGNMENT OF CHIPS FOR MOUNTING ON A SUBSTRATE

RELATED APPLICATION

This application is related to application Ser. No. 09/165,280, filed Oct. 2, 1998. The related application is assigned to the same assignee as the present application. The disclosure of the related application is incorporated herein by reference.

FIELD OF THE INVENTION

This invention relates to manufacturing of integrated circuit devices. More particularly, this invention relates to a precision alignment process in the fabrication of devices having a plurality of chips mounted on a substrate. Such devices include not only multichip modules (MCMs) as they are conventionally understood, but also systems having combinations of chips (sometimes called "macro chips") with different sizes, architectures and functions.

BACKGROUND OF THE INVENTION

In the manufacture of integrated circuit devices, system level integration on a single substrate is desirable for achieving higher system functionality and performance. Multichip modules (MCMs) permit a plurality of integrated circuit chips with unique functions and from different processing technologies to be integrated into a system. In an MCM, a group of highly functional devices is interconnected on a substrate; the substrate may have a multilayer structure to provide interconnection wiring for the chips. For example, U.S. Pat. No. 4,489,364, assigned to International Business Machines Corporation, discloses a ceramic chip carrier for supporting an array of chips by means of solder balls, such as controlled-collapse chip connections (C4s). Such MCMs tend to be expensive, due to their multilayered ceramic structure, and require significantly more area than the combined area of the chips.

Another trend in device manufacturing is the inclusion of several different functions on a single chip (a "system on a chip"), which generally requires both an increased chip size and a more complicated manufacturing process. These factors both tend to depress manufacturing yield. One method of maintaining acceptable yields is to manufacture smaller chips with specific functions ("macro chips"), and then to integrate those chips on a single silicon substrate. To maintain the advantages of the system-on-a-chip approach, it is necessary to mount these macro chips on the silicon substrate in close proximity and with precise alignment, and with minimal added complexity in the overall process.

Figure 1A:
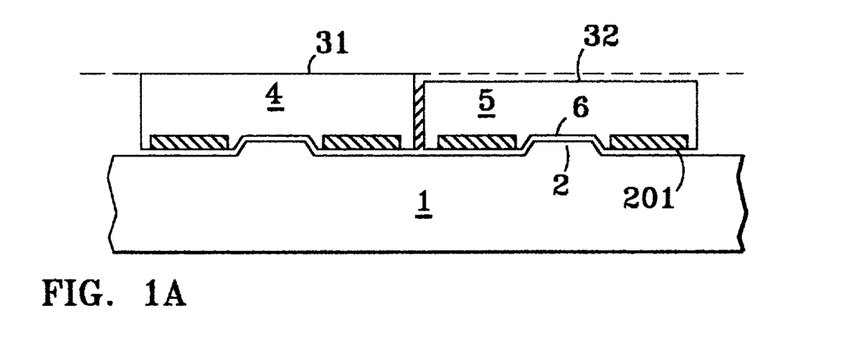
FIGS. 1A, 1B and 1C show steps in a fabrication process in accordance with a previous disclosure, wherein chips are matched to mesas formed in a guide wafer.
Figure 1B:
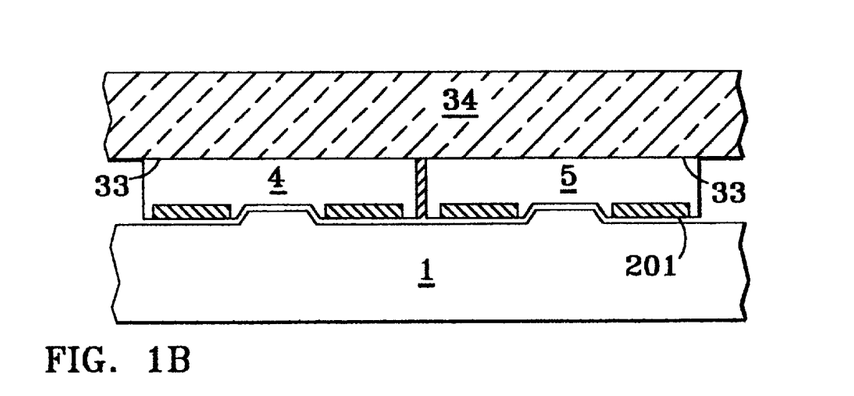
Figure 1C:
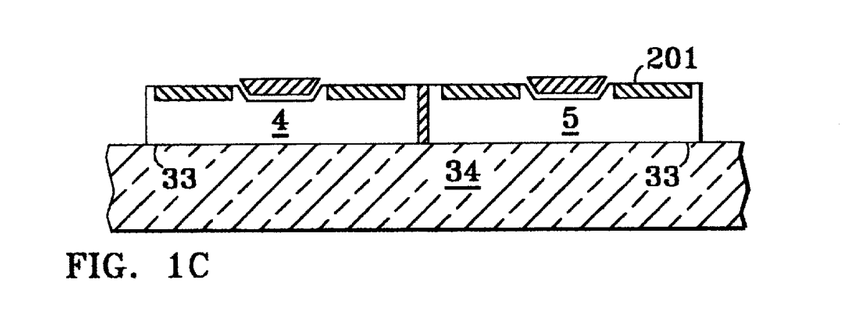

Recently, a manufacturing process has been proposed for forming a dense arrangement of chips on a silicon substrate or carrier wafer, using a silicon guide wafer. This process is described in detail in U.S. application Ser. No. 09/165,280, the disclosure of which is incorporated herein by reference. Briefly, the process involves bonding chips 4, 5 to a guide wafer 1, as shown in FIG. 1A. The chips are aligned to the guide wafer using depressions 6 etched in the chips (in kerf areas between active areas 201) which match mesas 2 formed in the guide wafer 1. The backside surfaces 31, 32 of the chips are then planarized to a level 33 and attached to a permanent substrate 34 (see FIG. 1B). The guide wafer 1 is removed, after which the exposed cavities 6 in the chips are filled (see FIG. 1C).

The bonding and removal of the chips to and from the guide wafer have presented manufacturing difficulties. Specifically, the chips were mated to the guide wafer using (111) crystallographic mesas and depressions and required appropriate photopattern alignment with the crystal orientations. Furthermore, the mating relied on oxide-oxide bonding (a sensitive surface activation process dependent on van der Waals forces). Accordingly, the bonding was highly sensitive to the cleanliness of the surfaces. In addition, this process required the use of the kerf area for the formation of the depression, thereby increasing the size of the chip. Also, the previous method of removing the guide wafer required physical grinding, polishing or wet etching of the wafer.

In view of these difficulties with the previously disclosed process, there remains a need for a fabrication process in which a dense arrangement of chips can be bonded to a carrier substrate with high manufacturing yield.

SUMMARY OF THE INVENTION

The present invention addresses the above-described need by providing a process for fabricating an integrated circuit device having a chip attached to a carrier substrate, wherein a guide substrate transparent to ablation radiation is used.

According to one aspect of the invention, a removable layer is provided on a surface of the guide substrate. A first alignment guide is formed on the removable layer, and a second alignment guide is formed on a front surface of the chip. The chip is aligned to the guide substrate by contacting the second alignment guide to the first alignment guide; the chip is then attached to the guide substrate. The carrier substrate is attached to the chip at the back surface of the chip. The interface between the removable layer and the guide substrate is then ablated using radiation (typically laser radiation) transmitted through the guide substrate, thereby detaching the guide substrate. Thin films with metal interconnections may then be provided on the front surface of the chip.

According to another aspect of the invention, a method is described for manufacturing an integrated circuit device having a plurality of chips mounted on a carrier substrate. A guide substrate, which is transparent to ablation radiation, is provided with at least one interconnection layer on a surface thereof. A first alignment guide is formed on the interconnection layer for aligning each of the chips, and a second alignment guide is formed on a surface of each of the chips. The chips are aligned to the guide substrate by contacting the second alignment guide to the first alignment guide for each chip, and the chips are attached to the guide substrate. The carrier substrate is then attached to the chips. Ablation radiation is transmitted through the guide substrate to ablate the interface between the guide substrate and the interconnection layer, thereby detaching the interconnection layer from the guide substrate.

The first and second alignment guides may advantageously be made by patterning a polyimide layer. The chips may be attached to the carrier substrate by using a eutectic alloying process.

Accordingly, a dense arrangement of interconnected chips may be formed on a carrier substrate, thereby obtaining the functional advantages of a system on a chip. The guide substrate, which is used to align the chips, is not ground or etched away but merely detached from the chips after they are bonded to the carrier substrate.

DETAILED DESCRIPTION OF THE PREFERRED EMBODIMENTS

A process for aligning and mounting chips according to a first embodiment of the present invention is shown schematically in FIGS. 2–8.

Figure 2:
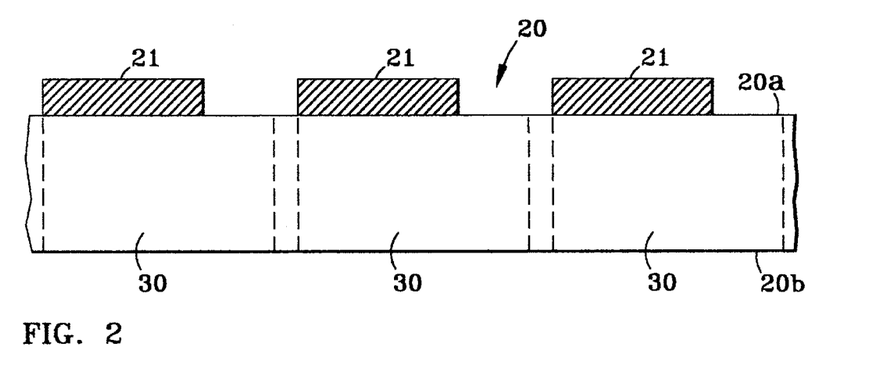
FIGS. 2–8 show steps in a fabrication process according to a first embodiment of the invention.

A semiconductor device wafer 20, having a front surface 20a and a back surface 20b, has active areas formed therein close to front surface 20a. After the wafer processing is completed, but before the wafer is diced into individual chips, a polyimide layer is deposited on the front surface 20a of the wafer and cured. The cured polyimide layer, 4 to 5 μm thick, is patterned using reactive-ion etching (RIE) to form an array of polyimide structures 21, as shown in FIG. 2. These polyimide structures have substantially vertical edges; furthermore, with presently available lithography techniques, they are aligned on the wafer with an accuracy of about 0.5 μm or better. The polyimide structures serve as alignment guides for the chips, as detailed below.

Other materials (e.g. polysilicon) may be used in place of polyimide. It is preferable that the material be easily patterned with standard lithography and etching techniques, so that an array of durable structures with substantially vertical edges is formed on the device wafer.

Figure 3:
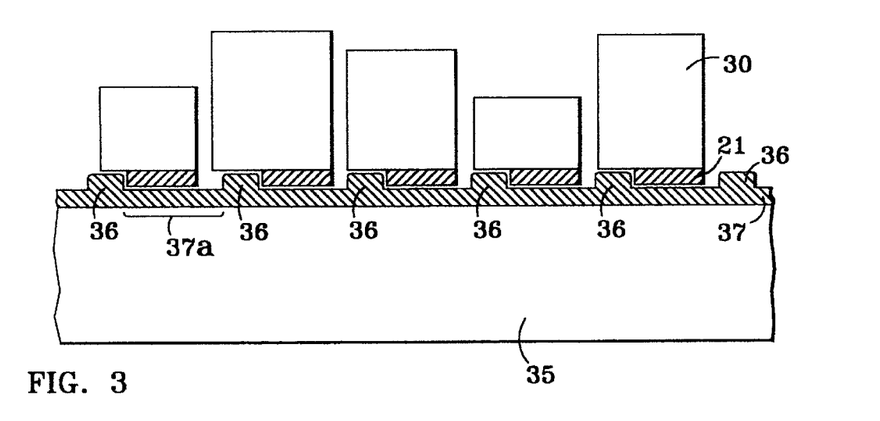

An integrated system may be built from macro chips having different functions and originating from different device wafers. Accordingly, adjacent chips may have different thicknesses, as shown in FIG. 3. Each chip 30 is then aligned to a substrate 35 of glass (or other material transparent to laser ablation light). The glass substrate 35 has a layer 37 of polyimide deposited on its top surface; layer 37 is then patterned to form alignment structures 36 having substantially vertical edges. Alternatively, as with the alignment guides 21, structures 36 may be made from any durable, easily patterned material. In another alternative process, the top surface of glass substrate 35 may be coated with a first layer of polyimide or Teflon®, and then with a second layer of polyimide which is patterned to form structures 36. The areas 37a between structures 36 may be etched away; in this case, only the structures 36 remain on the surface of the glass substrate 35.

After the alignment structures 36 are formed on the glass substrate 35, each chip 30 is precisely aligned by butting its polyimide alignment guide 21 against a corresponding polyimide alignment structure 36. At this point it is desirable for the polyimide alignment guide 21 on chip 30 to adhere to a vertical surface on alignment structure 36 or to a horizontal surface on layer 37, so that the chip is fixed in place. This may be done by using an epoxy to bond alignment guide 21 to layer 37. Alternatively, the surfaces of the polyimide structures 21, 36 may be treated (e.g. by applying a weak solvent after curing) or reactivated, so that those surfaces are slightly "tacky" before they are brought into contact with each other.

It should be noted that the guide substrate need not have any particular dimensions, provided that it has a flat surface (coated with layer 37) large enough to accommodate the chips. Furthermore, it is noteworthy that the periodicity of the chip alignment is controlled by the pattern of the alignment structures 36.

Figure 4:
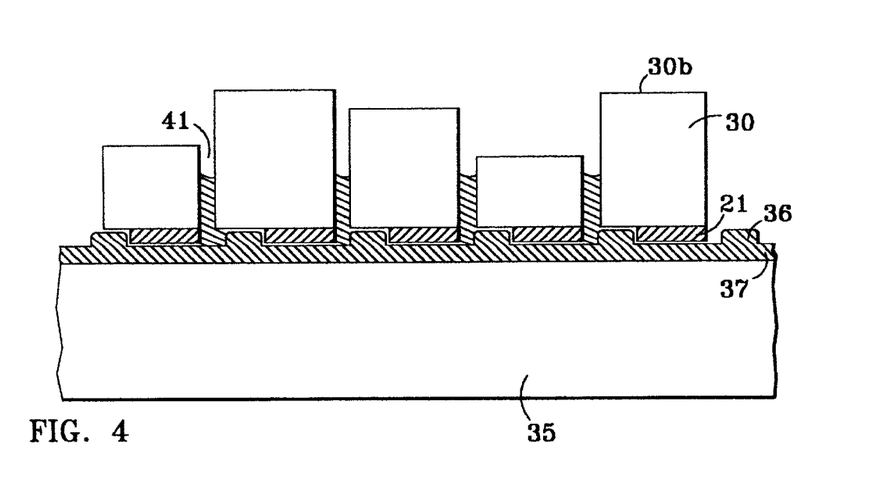

To build a dense array of chips (so as to arrive at an integrated system-on-a-chip structure), it is desirable that the alignment structures 36 be patterned so that the gaps 41 between adjacent chips are uniform and as narrow as possible (see FIG. 4). The minimum gap width (and hence the chip density) depends on the gap filling technique. Gaps as narrow as 60 μm may be filled with polyimide by dispensing the polyimide with a MicroPen™, manufactured by Ohmcraft™ of Honeoye Falls, N.Y.

FIG. 4 shows the gaps 41 between chips partially filled with a suitable material such as polyimide. Since the chips have their thicknesses reduced in a later processing step, the gaps 41 need only be filled to a level matching their eventual uniform thickness. The chips are then thinned and planarized, preferably by grinding and chemical-mechanical polishing (CMP) on their back surfaces 30b.

Figure 5:
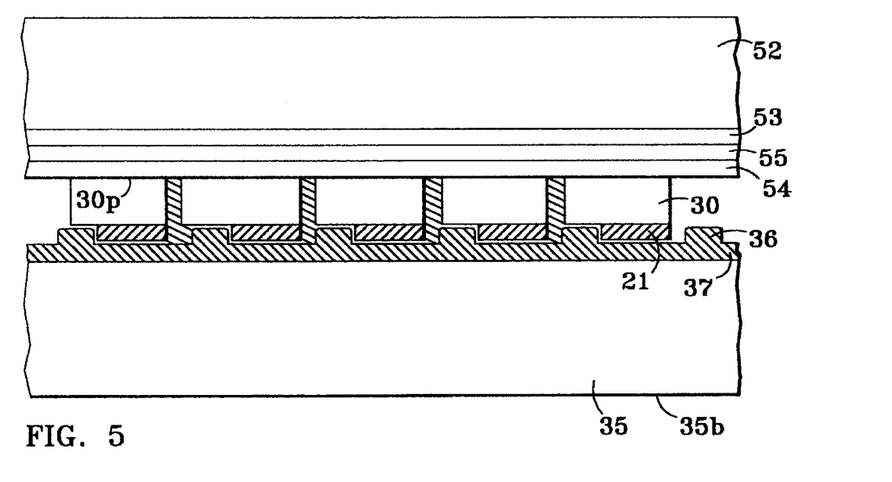

A silicon carrier substrate 52 is then bonded to the planarized back surface 30p of the chips, as shown in FIG. 5. As noted above, this bonding may be performed using oxide-oxide bonding or with the use of polyimide. However, it is preferable to use a metal alloying process, wherein an alloy is formed between metallized surfaces of the planarized chips and the carrier substrate 52. To perform this process, the carrier substrate 52 is first coated with a bonding layer 53 to ensure adhesion to the surface of the carrier substrate; for example, this layer may be a Ti/TiN combination or TiW. A similar layer 54 is deposited on the back surface 30p of the chips. The two metallized surfaces are then placed facing each other, with an alloying layer 55 placed between them. Alloying layer 55 is preferably a metal (e.g. Sn) or combination of metals (e.g. Au—Sn) which permits eutectic alloying below 40° C., in order to be compatible with previously processed materials. Using a slightly crushable Sn foil between the two metallized surfaces ensures good mechanical contact before alloying. Alternatively, an additional layer with suitable eutectic properties may be deposited on each bonding layer 53, 54, and the two metallized surfaces then brought into direct contact. Applying a heat treatment (below 400° C.) results in formation of an alloy between layer 55 and each of layers 53 and 54.

It should be noted that the substrate 52 can be of any convenient size and shape to accomodate the chips 30. In particular, if the chips are generally rectangular, the substrate may also be rectangular (for example, a 300 mm Si wafer trimmed to yield a square substrate 210 mm on a side).

Figure 6:
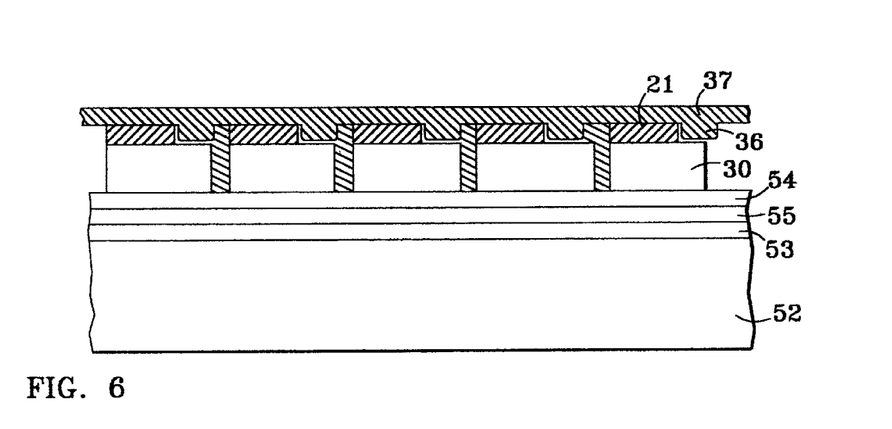
Figure 7:
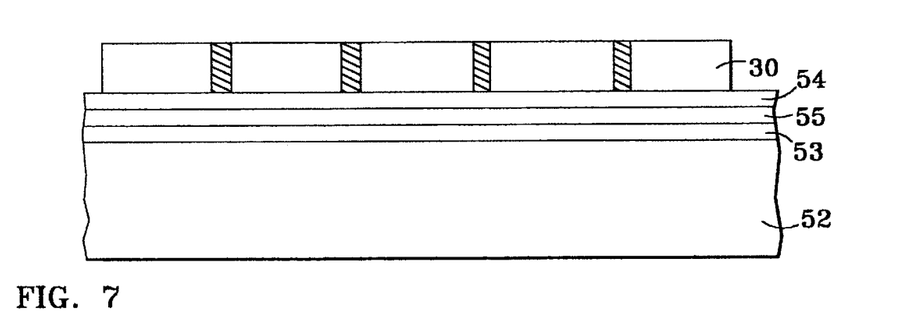
Figure 8:
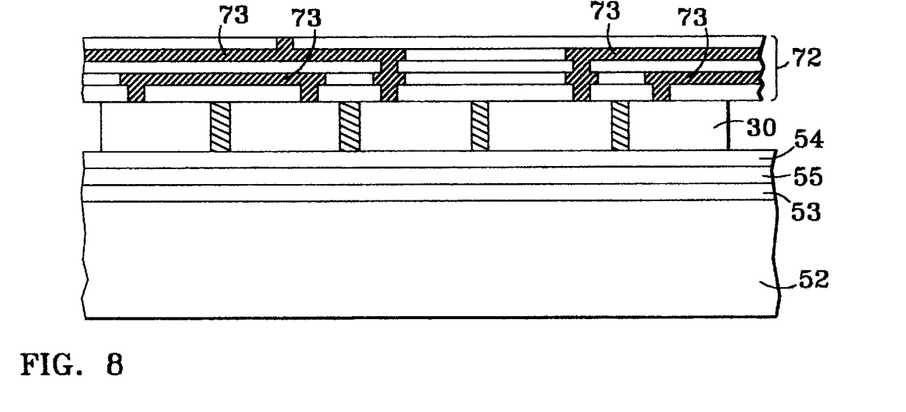

The structure shown in FIG. 5 is then subjected to a laser ablation process. Laser radiation, incident on the bottom surface 35b of glass substrate 35, penetrates the glass and ablates the interface between the glass and the layer 37. This results in delamination of the glass substrate from layer 37 and the polyimide alignment guides 21, 36 (see FIG. 6). Finally, the structure shown in FIG. 6 is planarized using a process such as CMP, to remove layer 37, the polyimide alignment guides and excess gap fill material. The resulting arrangement is shown in FIG. 7. The chips are then provided with metal interconnects utilizing standard hard masks. FIG. 8 shows a structure where the chips 30, bonded to carrier substrate 52, are interconnected by metal lines 73 in thin films 72. Details of the thin film and metallization processing are familiar to those skilled in the art.

Figure 9:
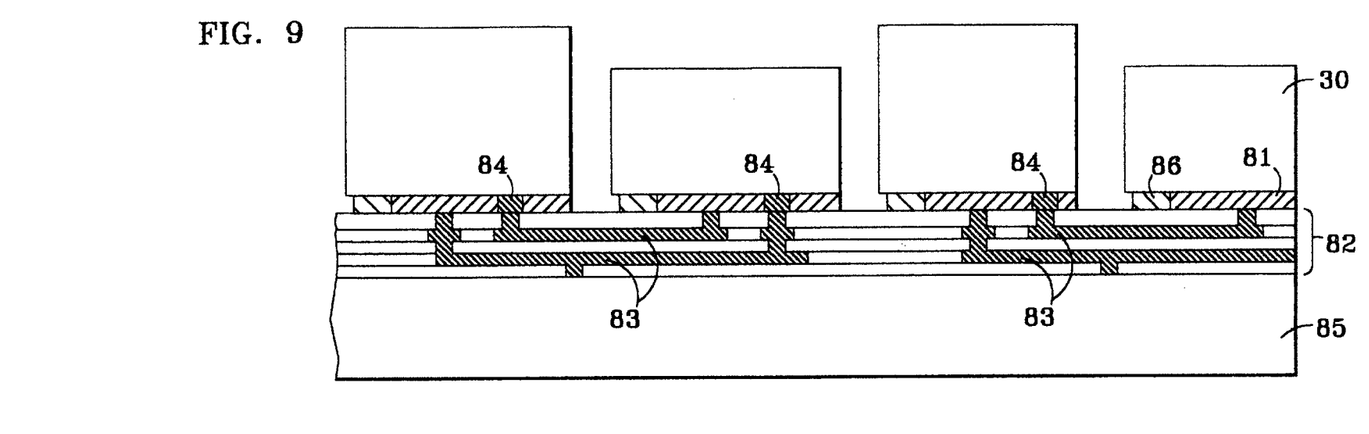
FIGS. 9–13 show steps in a fabrication process according to a second embodiment of the invention.
Figure 10:
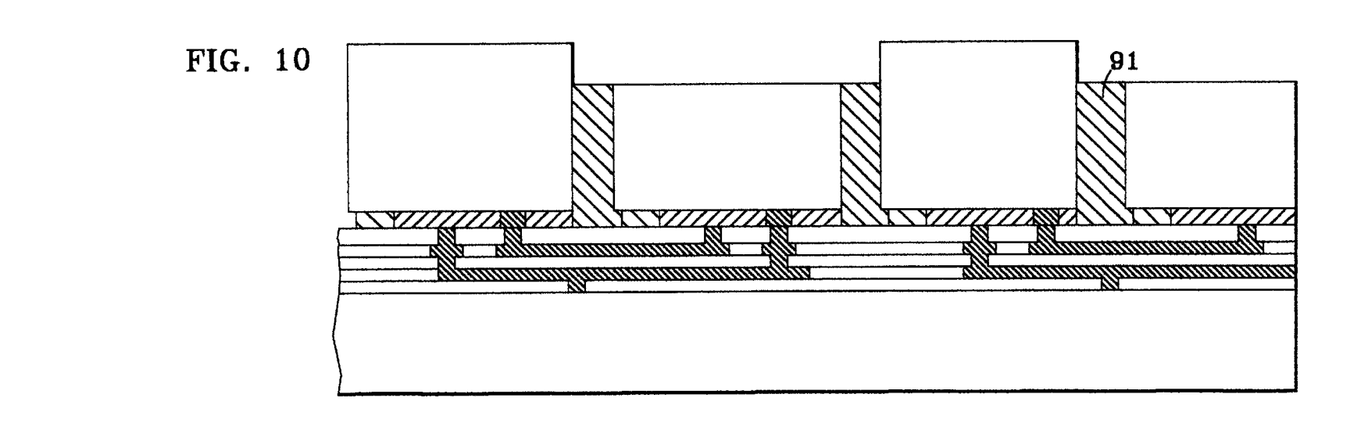

The chip interconnections may be made before the carrier wafer is attached to the chips, rather than afterward. In a second embodiment of the invention, one or more thin films 82 having metal lines 83 are deposited on a glass substrate 85. A polyimide layer is deposited on top of the thin films, and then patterned to form alignment guides 86. As in the first embodiment, the processed device wafer has a polyimide layer deposited thereon, which is then patterned so that each chip 30 has an alignment guide 81 with a substantially vertical edge. In this embodiment, the alignment guides 81 may themselves have metal lines 84 formed therein to facilitate electrical connection of the chip to the thin films to create the desired chip-to-chip interconnections. As described above, each chip 30 is aligned to the thin films by butting its alignment guide 81 against a corresponding alignment guide 86 on the thin film structure. The chips may be bonded to the thin films, or the alignment guides to each other, using epoxy or polyimide/polyimide adhesion as in the first embodiment. The resulting arrangement is shown in FIG. 9. The gaps 91 between chips are then filled with a suitable material such as polyimide (see FIG. 10).

Figure 11:
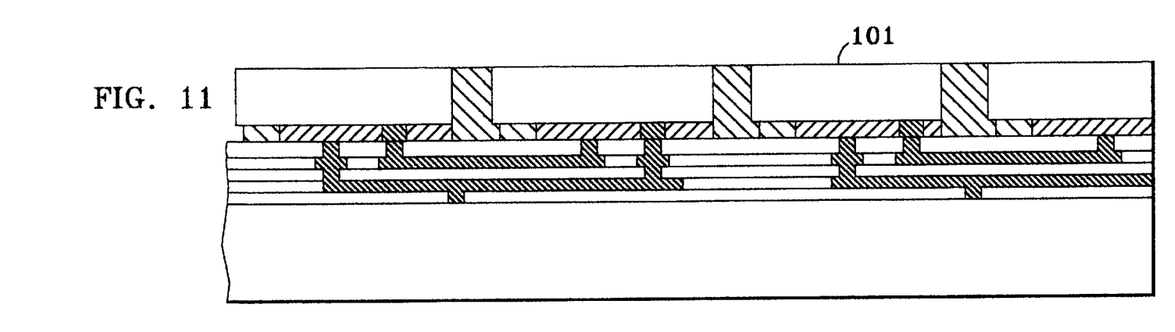
Figure 12:
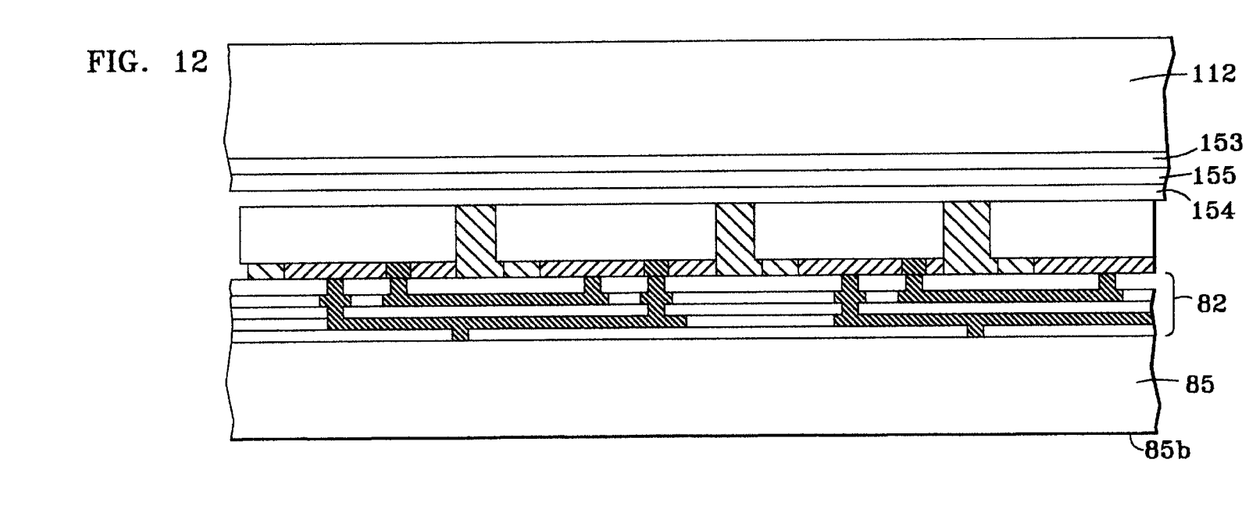

The chips are then thinned and planarized (preferably by if grinding and CMP), so that they have a planar back surface 101 (see FIG. 11). A silicon carrier substrate 112 is then bonded to this surface, as shown in FIG. 12. A metal alloying process is preferably used to bond the carrier substrate to the chips, as in the first embodiment. Accordingly, bonding layers 153 and 154 are deposited on substrate 112 and back surface 101, respectively, with an alloying layer 155 placed between them.

Figure 13:
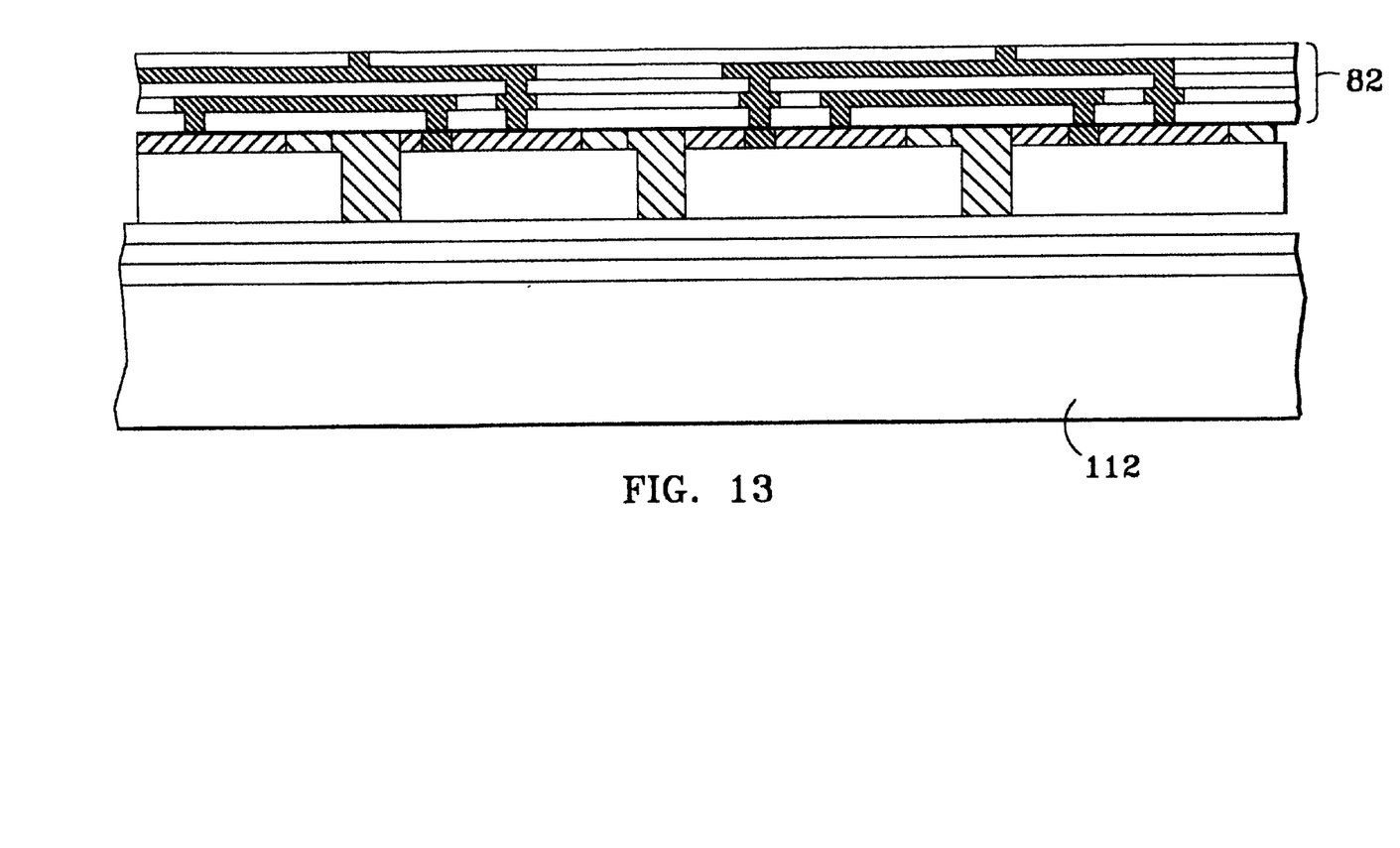

The structure shown in FIG. 12 is then subjected to a laser ablation process. Laser radiation, incident on the bottom surface 85b of glass substrate 85, penetrates the glass and ablates the interface between the thin films 82 and the glass substrate 85, thereby causing glass substrate to separate from the remainder of the structure. The resulting structure, including the chips, thin films, metal interconnections and carrier substrate, is shown in FIG. 13. It should be noted that in this second embodiment, the alignment structures 81, 86 remain in the completed module and have electrical connections made through them. No further chip-to-chip interconnect processing is required as is necessary in the first embodiment.

The present invention permits chips to be aligned and bonded to a guide substrate with a process much less sensitive to contamination than that previously disclosed. Furthermore, physical degradation of the guide substrate is avoided by using a glass substrate and a laser ablation technique.

It will be appreciated that by using the method described herein, a large integrated system can be built from a dense array of macro chips, while avoiding the yield losses inherent in processing a single large-area, multi-function system-on-a-chip.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

I claim:

1. A method for fabricating an integrated circuit device including chip mounted on a carrier substrate, the method comprising the steps of:

providing a guide substrate with a removable layer on a surface thereof, the guide substrate being transparent to ablating radiation;

forming a first alignment guide on the removable layer;

forming a second alignment guide on a front surface of the chip;

aligning the chip to the guide substrate by contacting the second alignment guide to the first alignment guide;

attaching the chip to the guide substrate;

attaching the carrier substrate to the chip; and ablating an interface between the removable layer and the guide substrate using ablating radiation transmitted through the guide substrate, thereby detaching the guide substrate.

2. A method according to claim 1, wherein the ablating radiation comprises laser radiation.

3. A method according to claim 1, wherein said removable layer comprises a first layer in contact with the guide substrate and a second layer on said first layer, said first alignment guide being formed on the second layer.

4. A method according to claim 1, wherein the first alignment guide and the second alignment guide are formed by patterning a polyimide layer.

5. A method according to claim 4, further comprising a step of reactivating a surface portion of the first alignment guide and a surface portion of the second alignment guide, before said aligning step.

6. A method according to claim 1, wherein said step of attaching the carrier substrate to the chip further comprises the steps of:

depositing a first metal layer on the carrier substrate;

depositing a second metal layer on the chip;

providing a third metal layer in contact with the first metal layer and in contact with the second metal layer; and forming an alloy between the first metal layer and the third metal layer and between the second metal layer and the third metal layer, thereby bonding the carrier substrate to the chip.

7. A method according to claim 6, wherein the step of forming an alloy comprises a eutectic alloying process.

8. A method according to claim 1, further comprising the step of planarizing a back surface of the chip before said step of attaching the carrier substrate, wherein the carrier substrate is attached to said surface of the chip.

9. A method according to claim 8, wherein said planarizing step is performed using chemical-mechanical polishing.

10. A method according to claim 1, further comprising the step of removing the first alignment guide and the second alignment guide from the device, after said step of ablating the interface between the removable layer and the guide substrate.

11. A method according to claim 10, wherein said removing step is performed using chemical-mechanical polishing.

12. A method according to claim 7, wherein said device includes a plurality of chips, and further comprising the step of providing a thin film on the chips after said removing step, the thin film having conductors therein to interconnect the chips, the thin film being patterned using a hard mask.

13. A method for fabricating an integrated circuit device having a plurality of chips mounted on a carrier substrate, the method comprising the steps of:

providing a guide substrate with at least one interconnection layer on a surface thereof, the guide substrate being transparent to ablation radiation;

forming a first alignment guide on the interconnection layer for aligning each of the chips;

forming a second alignment guide on a surface of each of the chips;

aligning the chips to the guide substrate by contacting the second alignment guide to the first alignment guide for each of the chips;

attaching the chips to the guide substrate;

attaching the carrier substrate to the chips; and transmitting ablation radiation through the guide substrate to ablate the interface between the guide substrate and the interconnection layer, thereby detaching the interconnection layer from the guide substrate.

14. A method according to claim 13, wherein the ablating radiation comprises laser radiation.

15. A method according to claim 13, wherein the first alignment guide and the second alignment guide are formed by patterning a polyimide layer.

16. A method according to claim 15, further comprising a step of reactivating a surface portion of the first alignment guide and a surface portion of the second alignment guide, before said aligning step.

17. A method according to claim 13, wherein said step of attaching the carrier substrate to the chips further comprises the steps of:

depositing a first metal layer on the carrier substrate;

depositing a second metal layer on the chips;

providing a third metal layer in contact with the first metal layer and in contact with the second metal layer; and forming an alloy between the first metal layer and the third metal layer and between the second metal layer and the third metal layer, thereby bonding the carrier substrate to the chips.

18. A method according to claim 17, wherein the step of forming an alloy comprises a eutectic alloying process.

19. A method according to claim 13, wherein the second alignment guide on each chip has a conducting portion formed therein, to make an electrical contact between the chip and the interconnection layer.

20. A method according to claim 13, further comprising the step of planarizing a back surface of the chips before said step of attaching the carrier substrate, wherein the carrier substrate is attached to said surface of the chips.

21. A method according to claim 20, wherein said planarizing step is performed using chemical-mechanical polishing.

* * * * *